United States Patent
Sung et al.

(10) Patent No.: US 10,510,870 B2
(45) Date of Patent: Dec. 17, 2019

(54) TECHNIQUES FOR FORMING DEVICE HAVING ETCH-RESISTANT ISOLATION OXIDE

(71) Applicant: Varian Semiconductor Equipment Associates, Inc., Gloucester, MA (US)

(72) Inventors: Min Gyu Sung, Essex, MA (US); Sony Varghese, Manchester, MA (US); Jae Young Lee, Bedford, MA (US); Johannes Van Meer, Middleton, MA (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 0 days.

(21) Appl. No.: 15/901,769

(22) Filed: Feb. 21, 2018

(65) Prior Publication Data

US 2019/0259859 A1    Aug. 22, 2019

(51) Int. Cl.
| | |
|---|---|
| H01L 21/336 | (2006.01) |
| H01L 29/66 | (2006.01) |
| H01L 21/762 | (2006.01) |
| H01L 21/3115 | (2006.01) |
| H01L 29/06 | (2006.01) |
| H01L 29/08 | (2006.01) |
| H01L 21/306 | (2006.01) |
| H01L 21/265 | (2006.01) |

(52) U.S. Cl.
CPC .. *H01L 29/66795* (2013.01); *H01L 21/26533* (2013.01); *H01L 21/30604* (2013.01); *H01L 21/31155* (2013.01); *H01L 21/762* (2013.01); *H01L 29/0653* (2013.01); *H01L 29/0847* (2013.01)

(58) Field of Classification Search
CPC .................................................. H01L 29/66795
USPC ........................................................... 438/283
See application file for complete search history.

(56) References Cited

U.S. PATENT DOCUMENTS

| | | | | |
|---|---|---|---|---|
| 8,610,241 | B1 * | 12/2013 | Hu | H01L 27/0629 257/353 |
| 9,570,557 | B2 * | 2/2017 | Chou et al. | H01L 21/30604 |
| 9,646,888 | B2 * | 5/2017 | Du | H01L 21/823481 |
| 9,793,381 | B2 * | 10/2017 | Choi et al. | H01L 29/66795 |

* cited by examiner

*Primary Examiner* — Caleb E Henry

(57) ABSTRACT

A method for forming a semiconductor device may include providing a transistor structure. The transistor structure may include a set of semiconductor fins and a set of gate structures, disposed on the set of semiconductor fins, wherein an isolation layer is disposed between the set of semiconductor fins and between the set of gate structures. The method may include implanting ions into an exposed area of the isolation layer, wherein an altered portion of the isolation layer is formed in the exposed area, wherein an altered region of the set of semiconductor fins is formed in an exposed portion of the set of semiconductor fins. The altered portion of the isolation layer may have a first etch rate, wherein an unaltered portion of the isolation layer, not exposed to the ions, has a second etch rate, greater than the first etch rate.

17 Claims, 10 Drawing Sheets

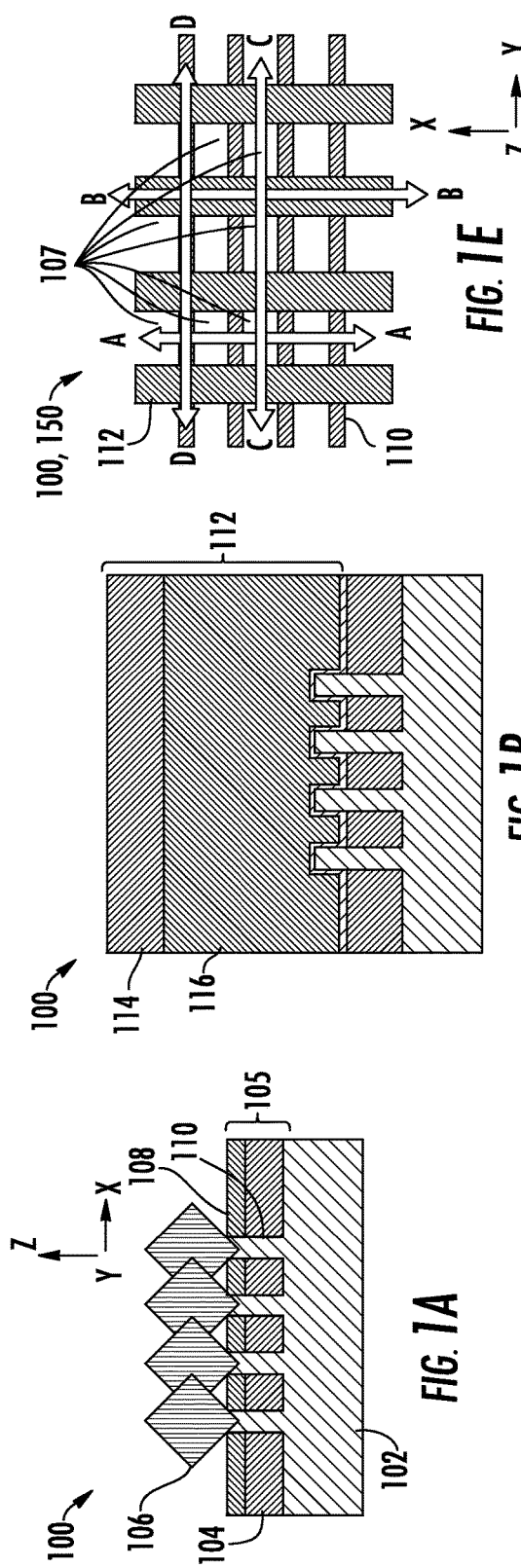

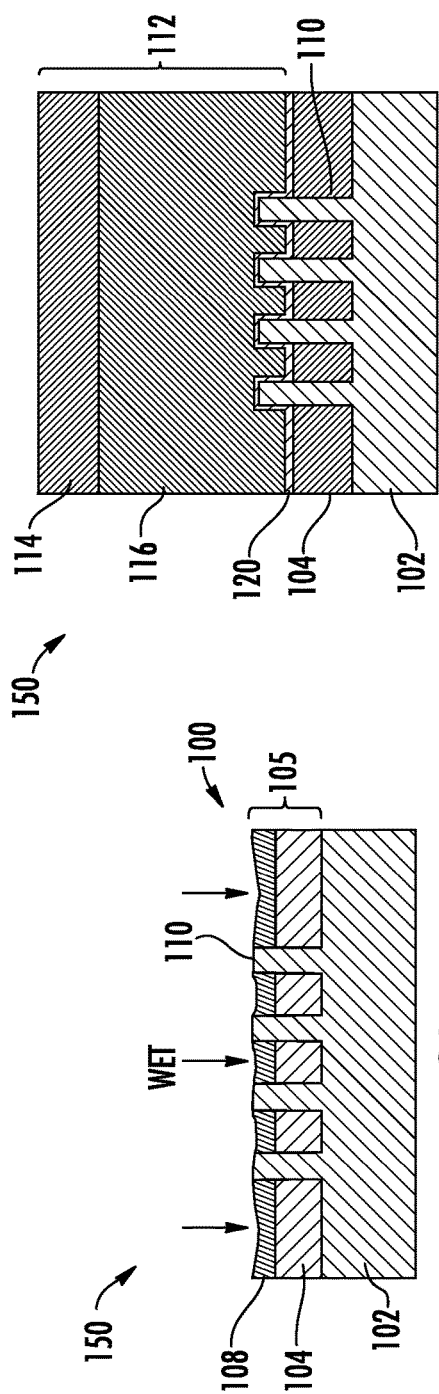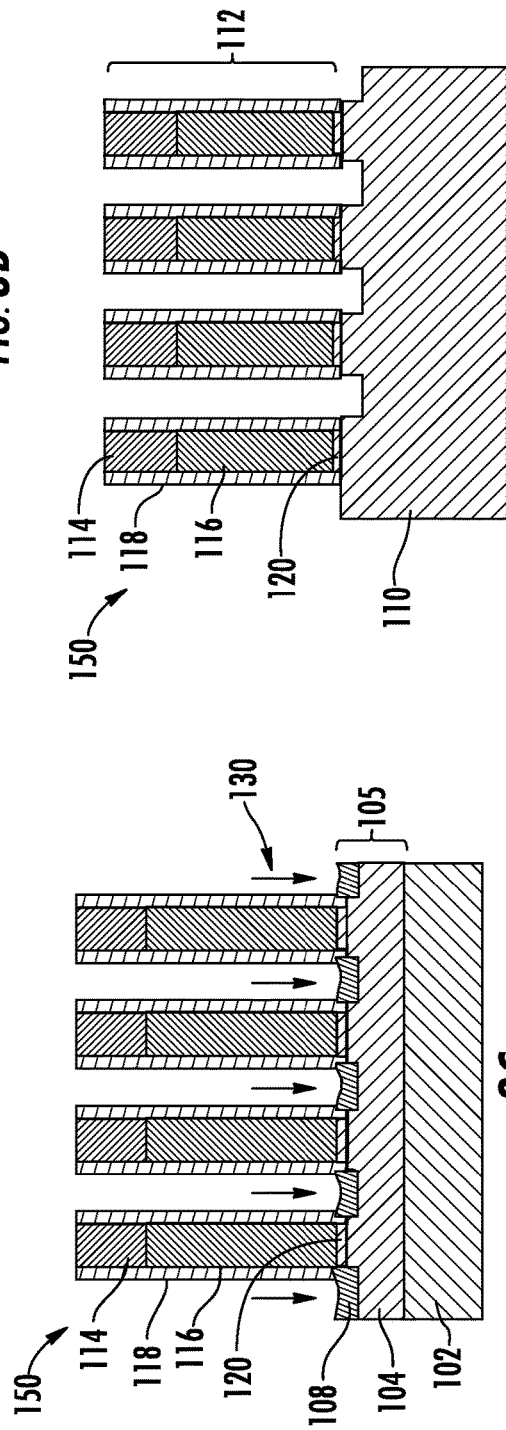

TECHNIQUES FOR FORMING DEVICE HAVING ETCH-RESISTANT ISOLATION OXIDE

FIELD

The present embodiments relate to semiconductor device structures, and more particularly, to structures and processing for transistor devices.

BACKGROUND

As semiconductor devices scale to smaller dimensions, the ability to avoid defects in device structures becomes more challenging. For example, the synthesis of three-dimensional semiconductor transistors, such as fin type field effect transistors (finFET), involves many deposition and etch operations to define a gate structure and source/drain (S/D) region of a transistor. Several of these operations may involve etchants exposing isolation structures, such as a shallow trench isolation (STI) layer, to undue etching. In some cases, the etching of the STI layer may be sufficient to undercut device structures, such as gate structures, causing gate bending or other defects, where such defects may degrade or destroy device performance.

With respect to these and other considerations, the present disclosure is provided.

BRIEF SUMMARY

In one embodiment, a method for forming a semiconductor device, may include providing a transistor structure, where the transistor structure includes a set of semiconductor fins and a set of gate structures that are disposed on the set of semiconductor fins. An isolation layer may be disposed between the set of semiconductor fins and between the set of gate structures. The method may include implanting ions into an exposed area of the isolation layer, wherein an altered portion of the isolation layer is formed in the exposed area, wherein an altered region of the set of semiconductor fins is formed in an exposed portion of the set of semiconductor fins. The altered portion of the isolation layer may have a first etch rate, wherein an unaltered portion of the isolation layer, not exposed to the ions, has a second etch rate, greater than the first etch rate.

In another embodiment, a device structure may include a set of semiconductor fins, a set of gate structures, disposed on the set of semiconductor fins, and an isolation layer, the isolation layer being disposed in an exposed area, between the set of semiconductor fins and between the set of gate structures. The isolation layer may include an altered portion, the altered portion being disposed in the exposed area. The isolation layer may further include an unaltered portion, disposed under the set of gate structures, wherein the altered portion of the isolation layer comprises a first etch rate, wherein the unaltered portion of the isolation layer comprises a second etch rate, less than the first etch rate.

In another embodiment, a method for forming a finFET device may include providing a transistor structure, where the transistor structure includes a set of semiconductor fins; a set of gate structures, disposed on the set of semiconductor fins, and an isolation layer. The isolation layer may include an insulator material and may be disposed in an exposed area, between the set of semiconductor fins and between the set of gate structures. The isolation layer may include an altered portion, where the altered portion is disposed in the exposed area. The method may further include implanting ions into the transistor structure, wherein after the implanting, the isolation layer comprises an altered portion, in the exposed area, and an unaltered portion, disposed under the altered portion and under the set of gate structures, and wherein an altered portion forms in the set of semiconductor fins. The method may also include etching the exposed portion of the set of semiconductor fins to remove the altered portion.

BRIEF DESCRIPTION OF THE DRAWINGS

FIG. 1A-1D depict a side cross-sectional view of a device structure, according to embodiments of the disclosure;

FIG. 1E depict a top plan view of a device structure, according to embodiments of the disclosure;

FIGS. 8A-8D shows a side cross-sectional view of the device structure of FIGS. 6A-6D, at a further stage of fabrication, according to embodiments of the disclosure;

DETAILED DESCRIPTION

Figure 2B:
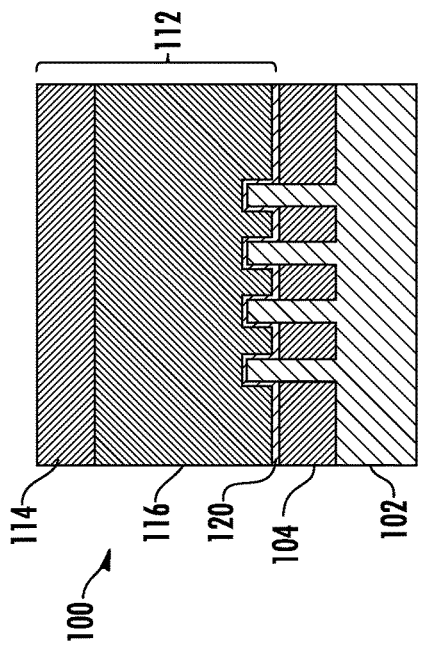
FIGS. 2A-2D shows a side cross-sectional view of a device structure, at one stage of fabrication, according to embodiments of the disclosure.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The present embodiments provide novel techniques and substrate structures to form devices, including three dimensional transistors, formed in a semiconductor substrate. As is known, three dimensional transistors, such as finFETs, may be arranged in circuitry to form various types of logic devices, as well as memory devices.

Figure 2D:
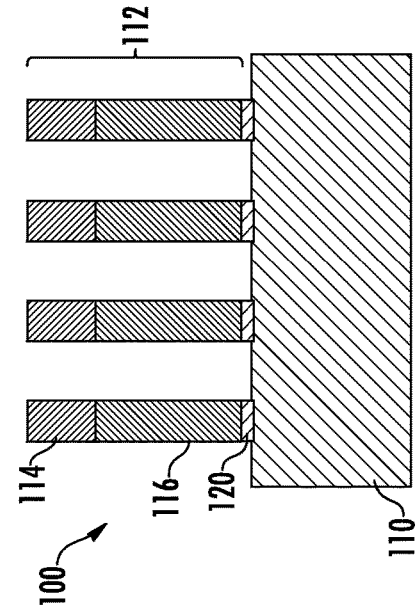
Figure 2A:
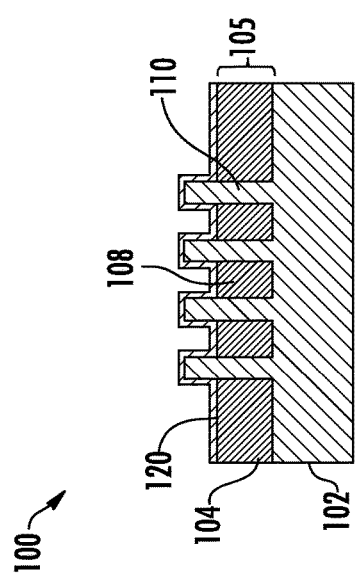
Figure 2C:
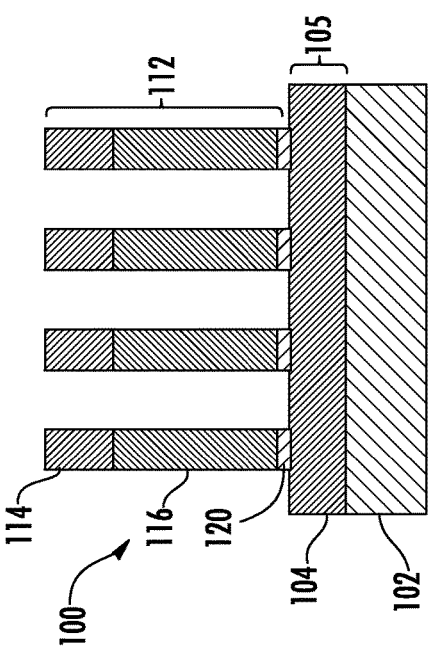

Turning now to FIG. 1A to FIG. 1E there is shown a device structure 100, according to embodiments of the disclosure. A device structure 100, 150 is shown in top plan view in FIG. 1E, as represented by the X-Y plane of the Cartesian coordinate system shown. The top plan view shown in FIG. 1E may represent a device structure 100, where details of the fabrication is discussed with respect to FIGS. 2A-5D, or may represent the device structure 150, where fabrication is detailed with respect to FIGS. 6A-9D. FIG. 1A, FIG. 1B, FIG. 1C, and FIG. 1D, show a side cross-sectional view of the device structure 100 along cut A-A, cut B-B, cut C-C, and cut D-D, respectively. Thus, the cut A-A applies to FIGS. 1A, 2A . . . -9A, the cut B-B applies to FIGS. 1B, 2B, . . . -9B the cut C-C applies to FIGS. 1C, 2C, . . . -9A, while the cut D-D applies to FIGS. 1D, 2D, . . . -9D. The device structure 100 illustrates several components of a three-dimensional transistor arrangement, based upon a finFET transistor device. In known finFET devices, multiple gate structures may be formed over a semiconductor fin, where at least one gate structure forms a transistor gate of an active transistor.

The device structure 100 includes a set of gate structures, shown as gate structures 112, disposed over a set of fin structures, shown as semiconductor fins 110, disposed over a substrate base 102, as well as an isolation layer 105, disposed in an exposed area 107, between the set of semiconductor fins and between the set of gate structures. The gate structures 112 include gate insulator 120, gate 116, gate mask 114, as well as sidewall spacers 118, as in known finFET devices. In some embodiments, the gate 116 may be a dummy gate of a replacement gate process, as in known replacement gate technology, and may be formed of a semiconductor, insulator, or metal. The gate mask 114 may be a known hard mask material, including, but not limited to, silicon nitride.

In the view of FIG. 1A, a cross-section of the device structure 100 is shown along a direction parallel to the long direction of gate structures 112, while lying between the gate structures 112, as shown in FIG. 1E. As shown in FIG. 1B, a cross-section of the device structure 100 is shown along a direction parallel to the long direction of gate structures 112, while lying within the gate structures 112, as shown in FIG. 1E. In the view of FIG. 1C, a cross-section of the device structure 100 is shown along a direction parallel to the long direction of the semiconductor fins 110, while lying between the semiconductor fins 110, as shown in FIG. 1E. As shown in FIG. 1D, a cross-section of the device structure 100 is shown along a direction parallel to the long direction of semiconductor fins 110, while lying within the semiconductor fins 110, as shown in FIG. 1E.

The isolation layer 105 includes an altered portion 108, where the altered portion 108 may be disposed in the exposed area 107. The isolation layer also includes an unaltered portion 104, where the unaltered portion 104 is disposed under the gate structures 112. In some embodiments, the unaltered portion 104 is also disposed under the altered portion 108, as shown in FIG. 1A and FIG. 1C. According to various embodiments, the isolation layer 105 may be formed of a known material such as $SiO_2$, or other known insulator used as STI material. According to various embodiments, the altered portion 108 differs from the unaltered portion 104. In various embodiments, the altered portion 108 may have first density, while the unaltered portion 104 has a second density, less than the first density. Another difference is that the altered portion 108 may be characterized by a first etch rate, while the unaltered portion 104 is characterized by a second etch rate, greater than the first etch rate. For example, in embodiments where the isolation layer 105 is formed from $SiO_2$, the etch rate in known etchants such as HF may be higher in the unaltered portion 104, as opposed to the altered portion 108. The higher etch rate in the unaltered portion 104 may be the result of a lower density. In some examples, the etch rate in the altered portion 108 may be reduced by 300% with respect to the etch rate of the unaltered portion for a given etchant.

In accordance with various embodiments of the disclosure, the altered portion 108 may include implanted species, such as inert gas species, or silicon, where the implanted species may be used to densify the isolation layer 105.

As further shown in FIG. 1A and FIG. 1D, the device structure 100 may further include a raised source/drain region 106, arranged on top of the semiconductor fins 110, between gate structures 112, as in known finFETs. Because the altered portion 108 is exposed between semiconductor fins 110 and gate structures 112, during formation of the raised source/drain region 106, the altered portion 108 may be exposed to at least one etch process, as in known finFET device processing. For example, several wet etch are used during known gate spacer modules for gate spacer formation and growth of epitaxial raised source/drain regions. Such modules may involve separate lithography and etching processes for NFET regions as opposed to PFET regions in complementary metal oxide semiconductor (CMOS) device, for example, exposing the isolation layer to many etch processes. Because the altered portion 108 has a lower etch rate than the unaltered portion 104, less etching of the isolation layer 105 takes place, and accordingly less attack of the gate structures 112, including isolation layer 105 recession and undercutting of gate structures 112 is present, as compared to known finFET devices.

Turning now to FIGS. 2A-5D, there are shown several instances during fabrication of a device structure 100, in accordance with some embodiments of the disclosure. In FIGS. 2A-2D there is shown an instance after formation of the gate structures 112. At this instance, the isolation layer 105 just includes an unaltered portion 104, extending throughout the isolation layer 105. As such, the structure shown in FIGS. 2A-2D may represent a known device structure after formation of a gate structure, before formation of raised source/drain structures. According to some embodiments, the thickness of the isolation layer 105 may be 30 nm to 100 nm. The embodiments are not limited in this context. Notably, while the gate 116 and gate mask 114 have been formed, no sidewalls are formed at this instance.

In FIGS. 3A-3D there is shown another instance, subsequent to the instance of FIGS. 2A-2D. In the operation shown, ions 122 are directed to the device structure 100. The ions 122 may be inert gas ions, such as helium ions according to some embodiments. The ions 122 may be silicon-containing ions, such as $Si^+$ in other embodiments. The embodiments are not limited in this context. The ions 122 may implant into the device structure 100, including into the exposed area 107 of the isolation layer 105 (see FIG. 1E, showing a plan view of the exposed area 107). As a result, the altered portion 108 of the isolation layer 105 is formed in the exposed area 107, leaving the unaltered portion 104, being disposed underneath the gate structures 112.

In accordance with some embodiments, the ion energy of ions 122 may range from 5 k eV to 15 keV. The atomic density of ions 122 may range from $1E20/cm^3$ to $10 E20/cm^3$. This atomic density may be generated by an appropriate ion flux, such as $5 E17~7E19/cm^2$. As such, in different embodiments, the thickness of the altered portion 108 may be 5 nm, 10 nm, or 15 nm. The embodiments are not limited in this context. Depending upon the thickness of the isolation layer 105, the implantation of ions 122 may not completely extend through the isolation layer 105, resulting in a part of the unaltered portion 104 being disposed under the altered portion 108, as shown in the figures.

Figure 3B:
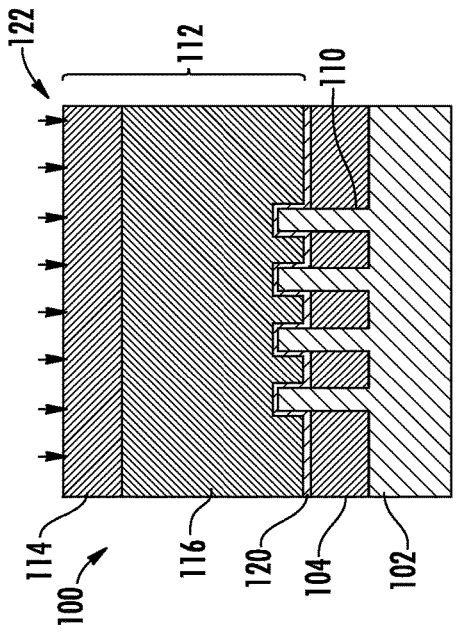
FIGS. 3A-3D shows a side cross-sectional view of the device structure of FIGS. 2A-2D at another stage of fabrication, according to embodiments of the disclosure.
Figure 3D:
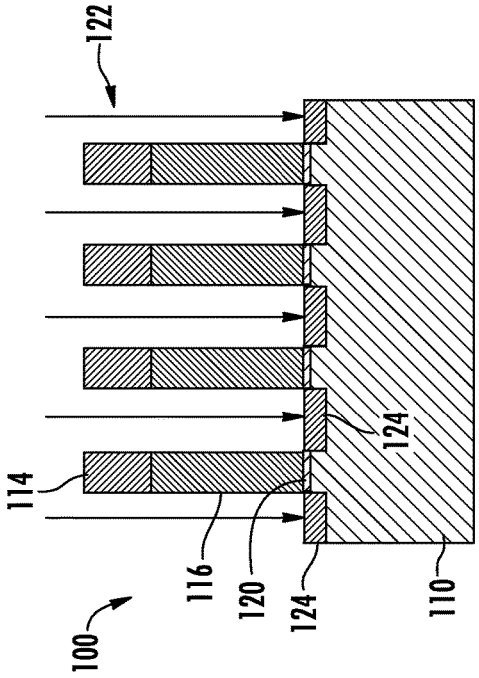
Figure 3A:
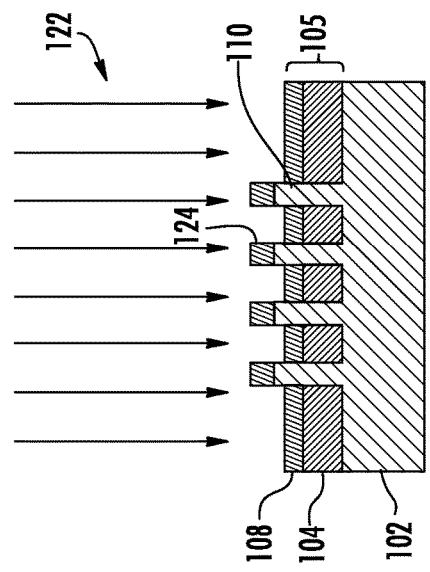
Figure 3C:
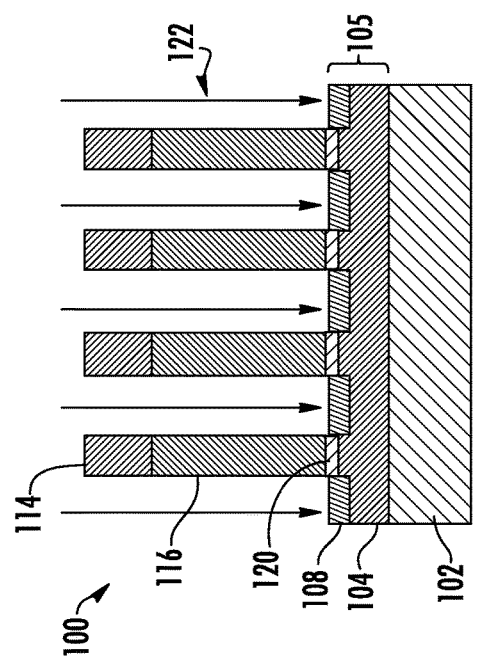
Figure 4A:
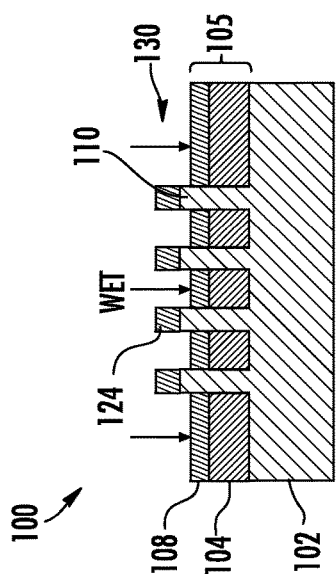
FIGS. 4A-4D shows a side cross-sectional view of the device structure of FIGS. 2A-2D, at a further stage of fabrication, according to embodiments of the disclosure.
Figure 4B:
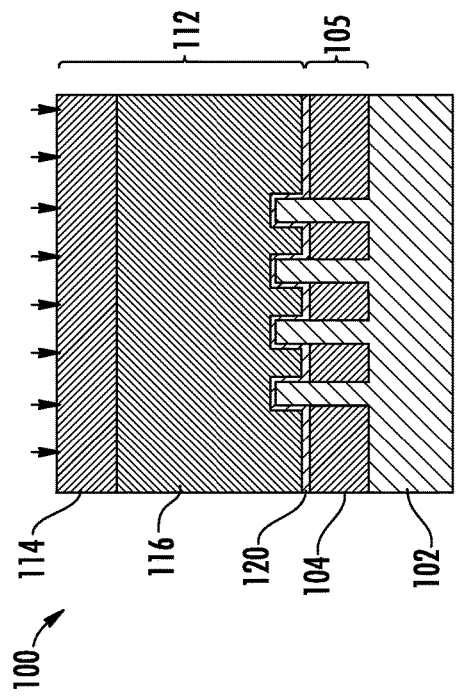
Figure 4C:
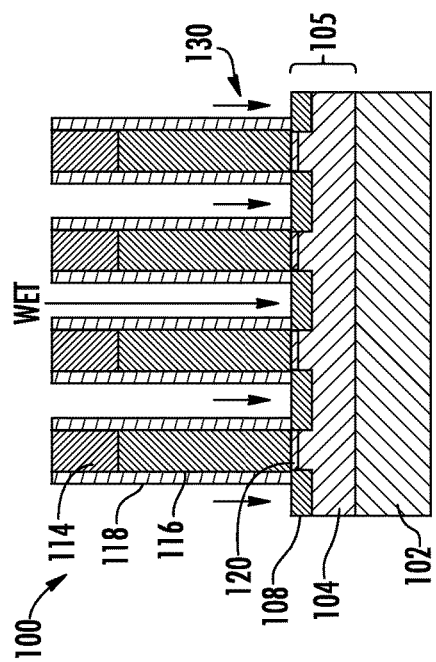
Figure 4D:
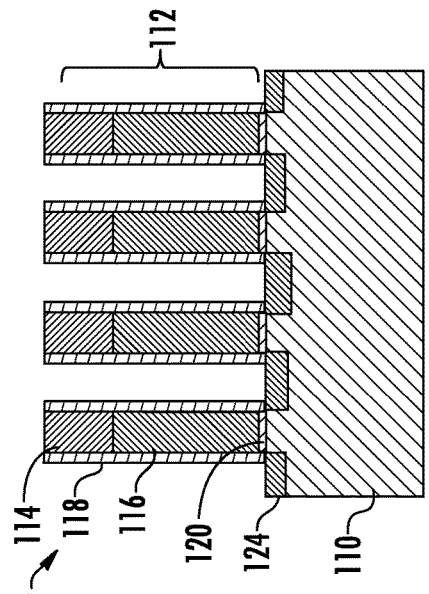

As shown in FIG. 3C and FIG. 3D, the gate structures 112 act as masks for the ions 122. According to various embodiments, the ions 122 may extend along vertical trajectories (parallel to the Z axis, as shown in FIG. 1A). Because the gate structures 112 do not include sidewall spacers, the altered portion 108 created by ions 122 extends to the edge of the gates 116. Additionally, because the gate structures 112 may extend to a height of 100 nm or more, the gate structures 112 may screen the ions 122 from striking the semiconductor fins 110 underneath the gate structures 112, since the ions 122 may implant to much shallower depth, such as 10 nm. This screening serves to protect active regions of the semiconductor fins 110.

Notably, the ions 122 also implant into portions of the device structure 100 between gate structures 112, generating damaged fin regions 124. Advantageously, these damaged fin regions 124 lie outside active fin regions.

In FIGS. 4A-4D there is shown another instance, subsequent to the instance of FIGS. 3A-3D. In the operation shown, sidewall spacers 118 are formed, such as by known processes. These processes may include deposition processes, lithography, and etching, including wet etching processes. The altered portions 108, by virtue of exposure to ions 122, may be densified and may be resistant to etching of wet etchants 130, used in the sidewall formation process, are directed to the device structure 100. As such, little erosion of the isolation layer 105 may take place.

Figure 5B:
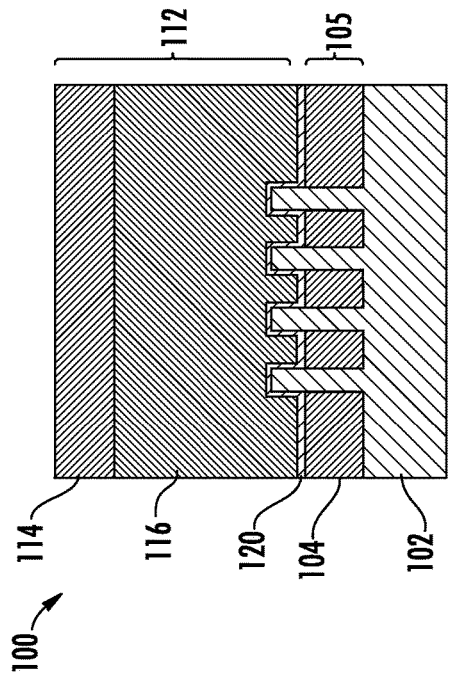
FIGS. 5A-5D shows a side cross-sectional view of the device structure of FIGS. 2A-2D, at a still further stage of fabrication, according to embodiments of the disclosure.
Figure 5D:
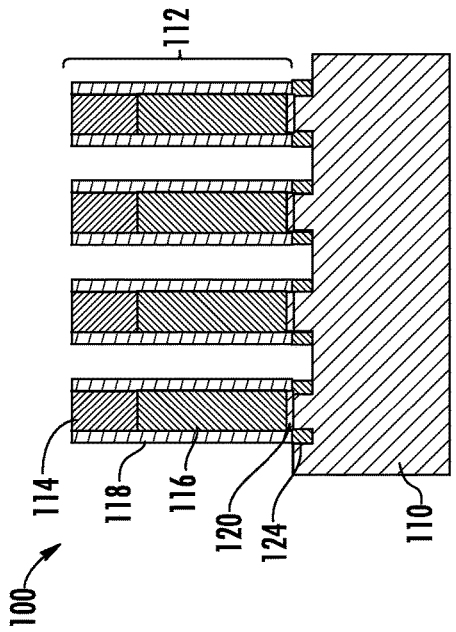
Figure 5A:
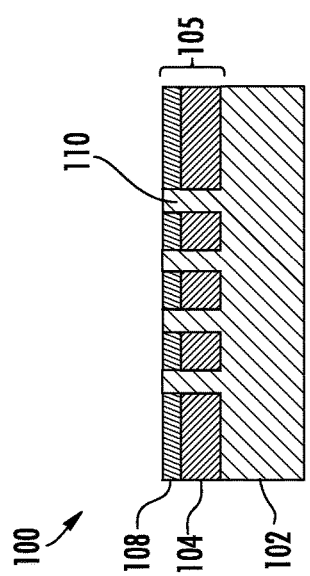
Figure 5C:
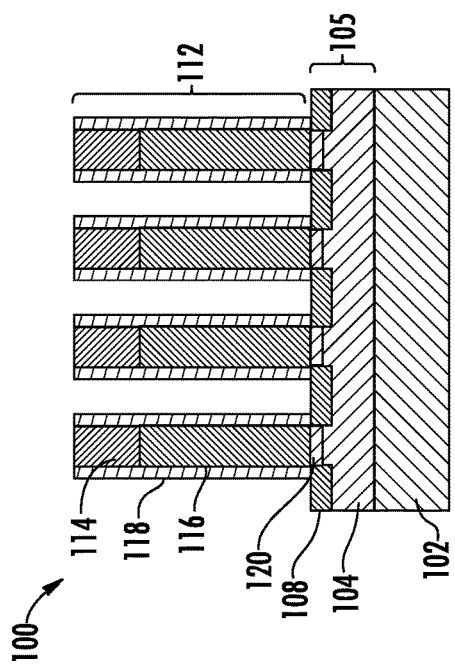
Figure 6B:
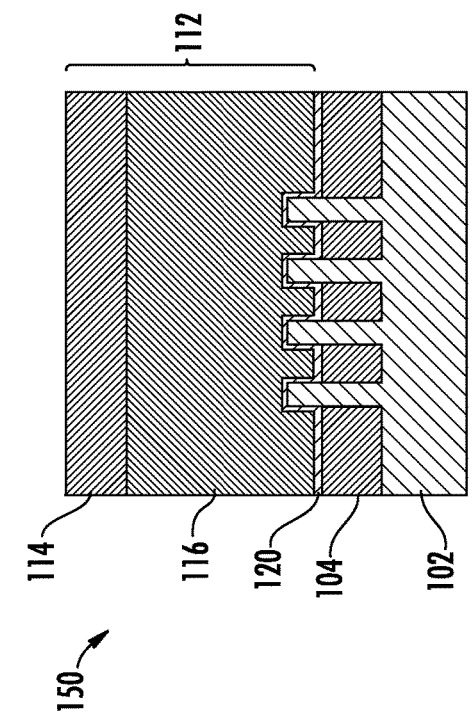
FIGS. 6A-6D shows a side cross-sectional view of an additional device structure, at one stage of fabrication, according to embodiments of the disclosure.
Figure 6D:
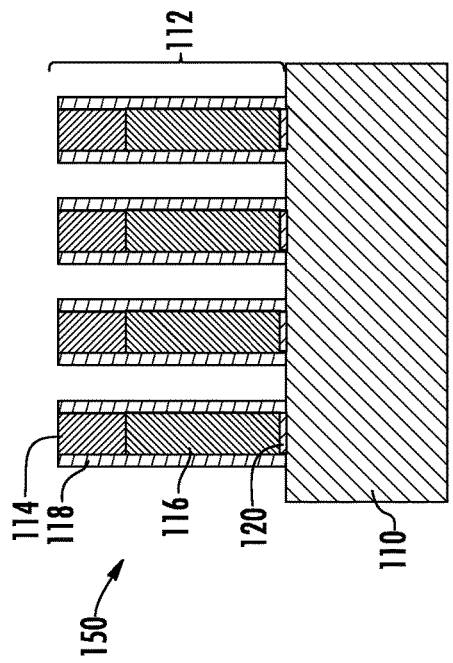
Figure 6A:
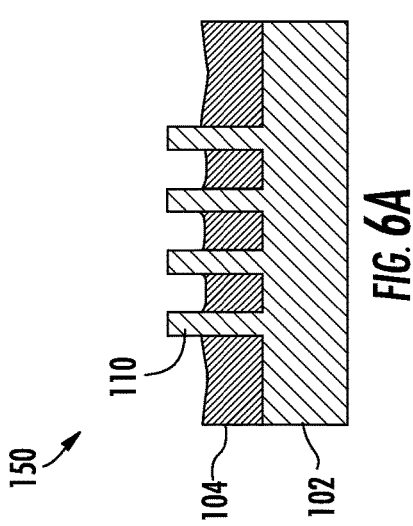
Figure 6C:
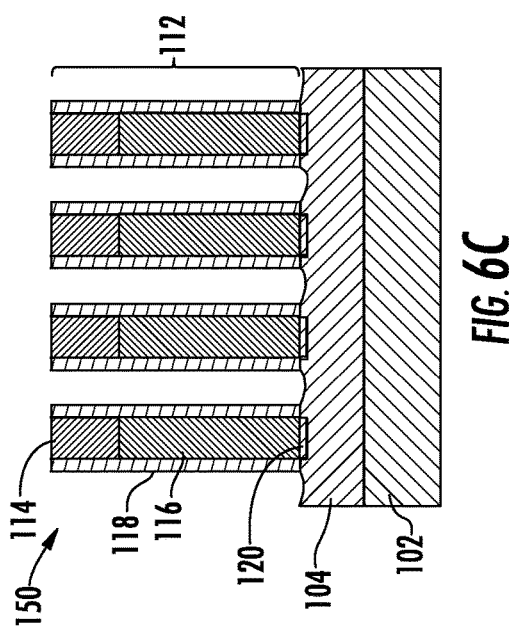

In FIGS. 5A-5D there is shown another instance, subsequent to the instance of FIGS. 4A-4D. In the operation shown, a recess etch has been performed to remove semiconductor material, such as silicon (in the case of silicon fins) from the semiconductor fins 110. The recess etch may be performed to prepare for epitaxial growth of semiconductor material in source/drain regions, generally as in known finFET processing. The recess etch may be selective so as to remove silicon, while not etching silicon oxide, for example. As such, the height of the semiconductor fins 110 may be reduced as shown in FIG. 5A, where the semiconductor fins 110 are approximately coplanar with the isolation layer 105. As such, the damaged fin regions 124 may be removed, leaving pristine semiconductor material at the top of the fin structures 112.

In a subsequent operation, epitaxial source/drain regions may be grown either in pFET regions, as well as nFET regions, resulting in the structure shown in FIGS. 1A-1D. Because little recess of the altered portion 108 takes place, the integrity of the gate structures 112 is improved as opposed to known processes.

Turning now to FIGS. 6A-6D, there are shown several instances during fabrication of a device structure 150, in accordance with some embodiments of the disclosure. In FIGS. 6A-6D there is shown an instance after formation of the gate structures 112. At this instance, the isolation layer 105 just includes an unaltered portion 104, extending throughout the isolation layer 105. As such, the structure shown in FIGS. 6A-6D may represent a known device structure after formation of a gate structure, before formation of raised source/drain structures. According to some embodiments, the thickness of the isolation layer 105 may be 30 nm to 100 nm. The embodiments are not limited in this context. Notably, in this embodiment, the gate structure 112 includes a gate 116 and gate mask 114, as well as sidewall spacers 118. In some embodiments, the sidewall spacers may be formed of SiN, SiBCN, SiOCN, or other known spacer material.

In FIGS. 7A-7D there is shown another instance, subsequent to the instance of FIGS. 6A-6D. In the operation shown, ions 122 are directed to the device structure 150. The ions 122 may have the properties as described above with respect to FIGS. 3A-3D. The embodiments are not limited in this context. The ions 122 may implant into the device structure 150, including into the exposed area 107 of the isolation layer 105 (see FIG. 1E, showing a plan view of the exposed area 107). As a result, the altered portion 108 of the isolation layer 105 is formed in the exposed area 107, leaving the unaltered portion 104, being disposed underneath the altered portion 108.

Figure 7B:
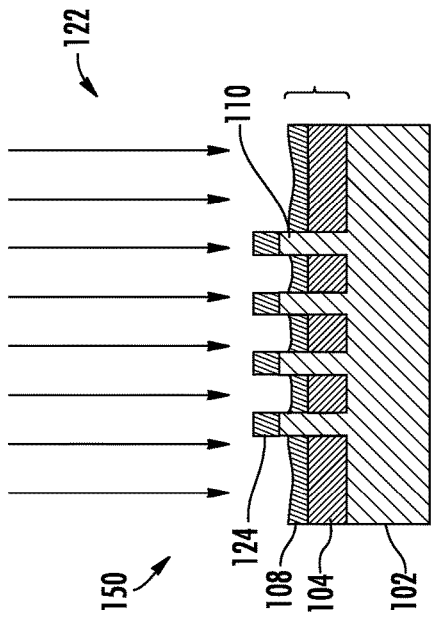
FIGS. 7A-7D shows a side cross-sectional view of the device structure of FIGS. 6A-6D, at another stage of fabrication, according to embodiments of the disclosure.
Figure 7D:
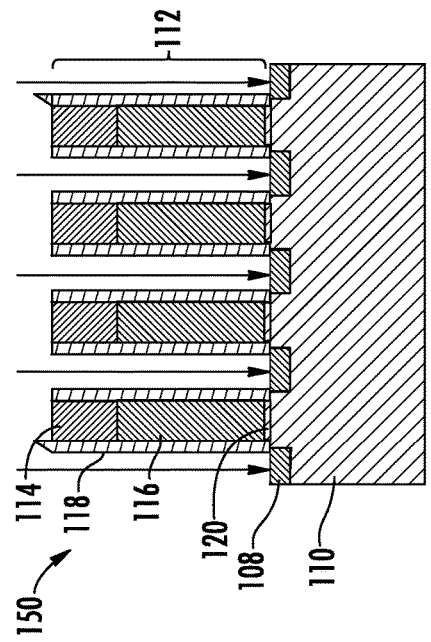
Figure 7A:
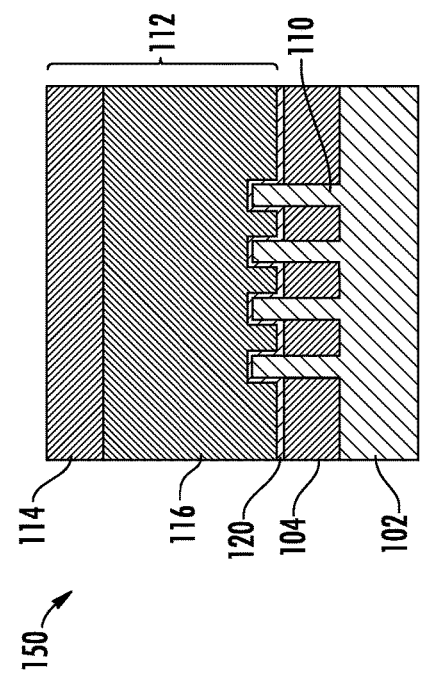
Figure 7C:
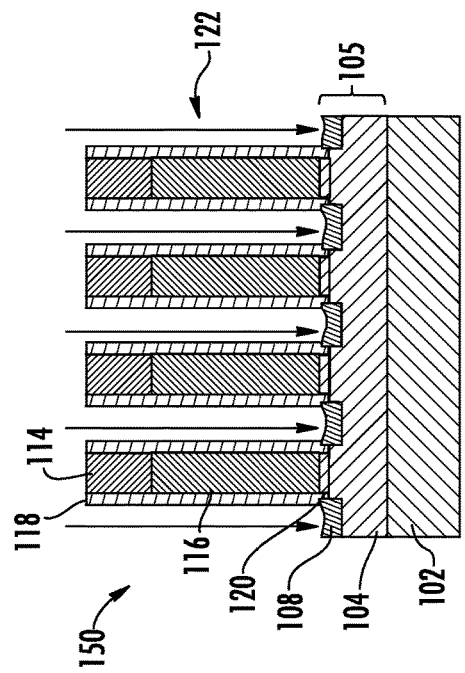
Figure 9B:
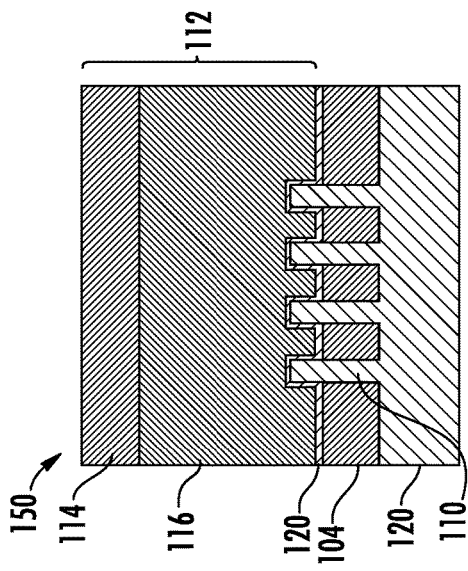
FIGS. 9A-9D shows a side cross-sectional view of the device structure of FIGS. 6A-6D, at a still further stage of fabrication, according to embodiments of the disclosure.
Figure 9D:
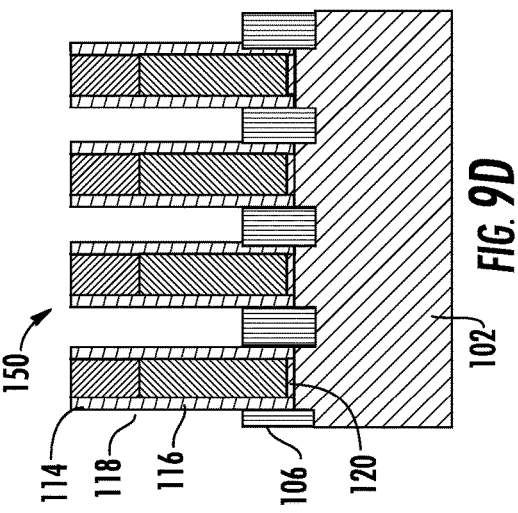
Figure 9A:
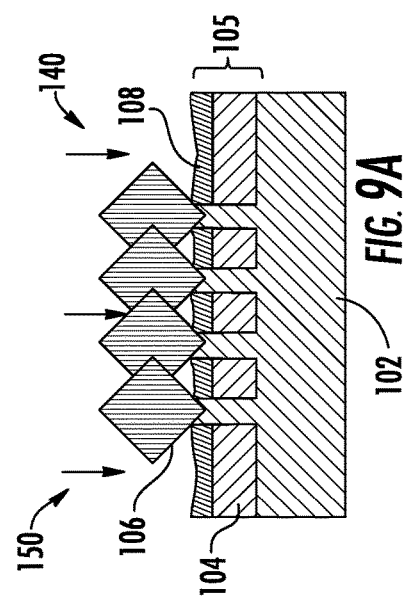
Figure 9C:
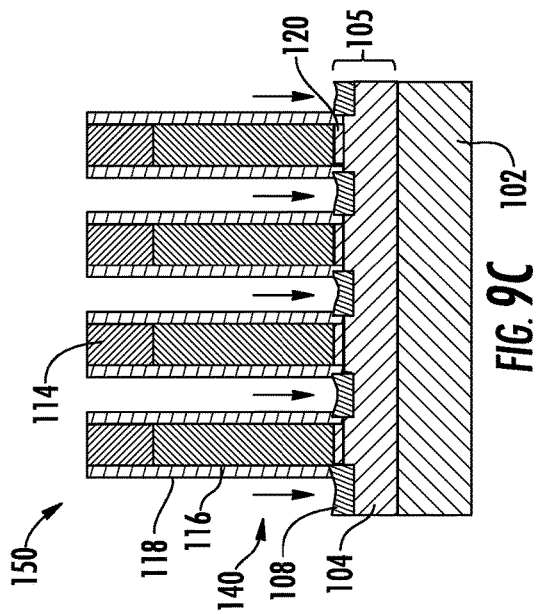

As shown in FIG. 7C and FIG. 7D, the gate structures 112 act as masks for the ions 122. According to various embodiments, the ions 122 may extend along vertical trajectories (parallel to the Z axis, as shown in FIG. 1A). Because the gate structures 112 do include sidewall spacers 118, the altered portion 108 created by ions 122 is spaced apart from the edge of the gates 116, according to the thickness of the sidewall spacers 118 (along the X-axis). Additionally, because the gate structures 112 may extend to a height of 100 nm or more, the gate structures 112 may screen the ions 122 from striking the semiconductor fins 110 underneath the gate structures 112, since the ions 122 may implant to much shallower depth, such as 10 nm. This screening serves to protect active regions of the semiconductor fins 110.

Notably, the ions 122 also implant into portions of the device structure 100 between gate structures 112, generating damaged fin regions 124. These damaged fin regions 124 lie outside active fin regions. As shown in FIG. 7D, the portion of semiconductor fins 110 lying underneath the sidewall spacers 118 is not damaged, since the sidewall spacers 118 are in place before the ions 122 are implanted into the device structure 150.

In FIGS. 8A-8D there is shown another instance, subsequent to the instance of FIGS. 7A-7D. In the operation shown, a recess etch has been performed to remove semiconductor material, such as silicon (in the case of silicon fins) from the semiconductor fins 110. The recess etch may be performed to prepare for epitaxial growth of semiconductor material in source/drain regions, generally as in known finFET processing. The recess etch may be selective so as to remove silicon while not etching silicon oxide, for example. As such, the height of the fin structures 112 may be reduced as shown in FIG. 5A, where the semiconductor fins 110 are approximately coplanar with the isolation layer 105. As such, the damaged fin regions 124 may be removed, leaving pristine semiconductor material at the top of the fin structures 112. In this example, the isolation layer 105 underneath the sidewall spacers 118 is not densified, as shown in FIG. 8C. Additionally, the fin regions of semiconductor fins 110 lying underneath sidewall spacers 118 is not damaged.

In a subsequent operation, epitaxial source/drain regions may be grown either in pFET regions, as well as nFET regions, resulting in the structure shown in FIGS. 9A-9D. The growth of the source/drain regions 106 is accomplished using wet etching processes, indicated by the wet etchant 140. Because the altered portions 108 are resistant to the wet etchant, little recess of the altered portions 108 takes place, and the integrity of the gate structures 112 is improved as opposed to known processes. A difference between the embodiment of FIGS. 6A-9D as opposed to the embodiment of FIGS. 2A-5D is that more wet etching takes place before ion implantation, leading to possible more recess of isolation layer 105, as shown, for example, at FIG. 6A and FIG. 6C. Notably, the amount of recess of isolation layer 105 in the embodiment of FIGS. 6A-9D is substantially less than in known processes where the isolation layer 105 is not implanted during the raised source/drain formation. Another difference is that the portion of fins underneath sidewall spacers 118 is not damaged by implantation in the embodiments of FIG. 6A-9D. Accordingly, the selection of when to perform implantation of ions 122 may hinge on the relative importance of semiconductor damage under sidewall spacers as opposed to greater recess of isolation oxide. Notably, in both embodiments, the relative recess of isolation oxide may be substantially less than in known schemes for forming finFETs.

Figure 10:
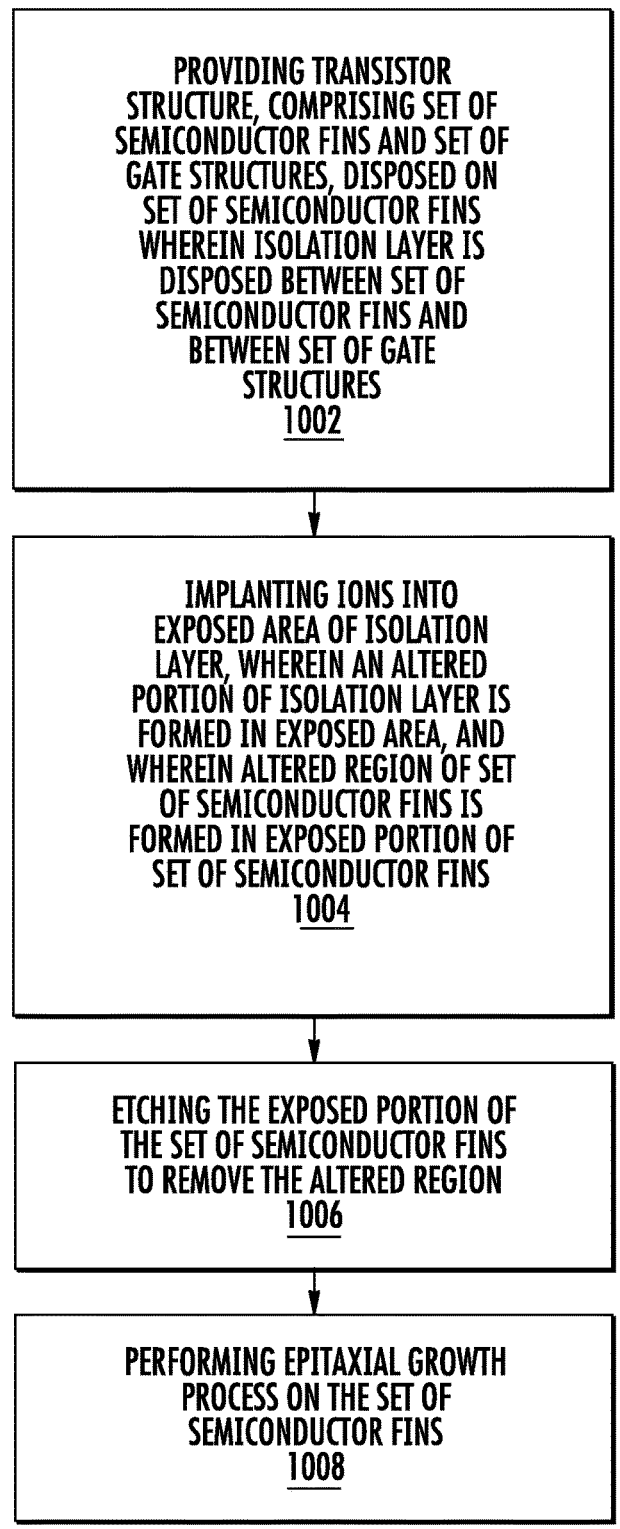
FIG. 10 shows an exemplary process flow, according to further embodiments of the disclosure.

FIG. 10 depicts an exemplary process flow 1000, according to embodiments of the disclosure. At block 1002, a transistor structure is provided. The transistor structure may include a set of semiconductor fins and a set of gate structures, disposed on set of semiconductor fins. In some embodiments, the semiconductor fins may be monocrystalline silicon. In some embodiments, the set of gate structures may be replacement or dummy gates. In particular embodiments, the gate structures may be formed with sidewall spacers, while in other embodiments the gate structures may not include sidewall spacers. The transistor structure may also be arranged wherein an isolation layer is disposed between the set of semiconductor fins and between set of gate structures. In various embodiments, the isolation layer may be silicon oxide or other material, and may extend so as to cover a portion of the semiconductor fins, while not covering a top portion of the semiconductor fins.

At block 1004, ions are implanted into an exposed area of the isolation layer, wherein an altered portion of the isolation layer is formed in the exposed area. In some embodiments, the ions may be inert gas ions, such as helium, while in other embodiments, the ions may be silicon-containing species. In addition, an altered or damaged region of the set of semiconductor fins is formed in an exposed portion of set of semiconductor fins receiving ion implantation.

At block 1006, the exposed portion of the set of semiconductor fins is etched to remove the altered region.

At block 1008, an epitaxial growth process is performed on the set of semiconductor fins.

The present embodiments provide various advantages over known device structures. For one advantage, wider process window is enabled for gate spacer formation and epitaxial source/drain growth, since the altered regions of an isolation layer are less susceptible to attack by etchants used in such processes. For another advantage, device yield may be increased by reducing the likelihood of gate deformation due to attack of STI layers from wet etchants.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method for forming a semiconductor device, comprising:
providing a transistor structure, the transistor structure comprising a set of semiconductor fins and a set of gate structures, disposed on the set of semiconductor fins, wherein an isolation layer is disposed between the set of semiconductor fins and between the set of gate structures;
implanting ions into an exposed area of the isolation layer, wherein an altered portion of the isolation layer is formed in the exposed area, wherein an altered region of the set of semiconductor fins is formed in an exposed portion of the set of semiconductor fins; and
performing an epitaxial growth process on the set of semiconductor fins, the performing the epitaxial growth process further comprising performing a wet etch that etches the altered portion of the isolation layer at a first etch rate, and etches an unaltered portion of the isolation layer, not exposed to the ions, at a second etch rate, greater than the first etch rate.

2. The method of claim 1, further comprising:
etching the exposed portion of the set of semiconductor fins to remove the altered region before the
performing the epitaxial growth process on the set of semiconductor fins.

3. The method of claim 2, wherein, during the implanting, a gate structure of the plurality of gate structures comprises a gate and a gate mask, and does not comprise a sidewall spacer, the method further comprising:
forming the sidewall spacer before the etching the exposed portion of the set of semiconductor fins.

4. The method of claim 1, wherein, during the implanting, the gate structure comprises a gate conductor, a gate mask, and a sidewall spacer.

5. The method of claim 1, wherein the ions comprise an inert gas species or a silicon-containing species.

6. The method of claim 5, wherein the implanting the ions comprises implanting an ion dose of 5E17 to 7E19/cm$^2$.

7. The method of claim 5, wherein the ions comprise an ion energy of 5 keV to 15 keV.

8. The method of claim 1, wherein the altered portion comprises a first density, and wherein the unaltered portion comprises a second density, less than the first density.

9. A method for forming a finFET device, comprising:
providing a transistor structure, the transistor structure comprising:
a set of semiconductor fins;
a set of gate structures, disposed on the set of semiconductor fins, wherein the set of semiconductor fins includes an exposed portion; and
an isolation layer, the isolation layer comprising an insulator material and being disposed in an exposed area, between the set of semiconductor fins and between the set of gate structures;
implanting ions into the transistor structure, wherein after the implanting, the isolation layer comprises an altered portion, in the exposed area, and an unaltered portion, disposed under the altered portion and under the set of gate structures, and wherein an altered portion forms in the set of semiconductor fins;
etching the exposed portion of the set of semiconductor fins to remove the altered portion;
performing an epitaxial growth process on the set of semiconductor fins, the performing the epitaxial growth process further comprising performing a wet etch that etches the altered portion of the isolation layer at a first etch rate, and etches an unaltered portion of the isolation layer, not exposed to the ions at a second etch rate, greater than the first etch rate.

10. The method of claim 9, wherein the ions comprise an inert gas species or a silicon species, having an ion energy of 5 keV to 15 keV.

11. The method of claim 9, wherein the altered portion comprises a first density, and wherein the unaltered portion comprises a second density, less than the first density.

12. A method for forming a semiconductor device, comprising
providing a transistor structure, the transistor structure comprising a set of semiconductor fins and a set of gate structures, disposed on the set of semiconductor fins, wherein an isolation layer is disposed between the set of semiconductor fins and between the set of gate structures;
implanting ions into an exposed area of the isolation layer, wherein, during the implanting, a given gate structure of the set of gate structures comprises a gate and a gate mask, and does not comprise a sidewall spacer,
wherein an altered portion of the isolation layer is formed in the exposed area, wherein an altered region of the set of semiconductor fins is formed in an exposed portion of the set of semiconductor fins,
and wherein the altered portion of the isolation layer comprises a first etch rate, wherein an unaltered portion of the isolation layer, not exposed to the ions, comprises a second etch rate, greater than the first etch rate;
forming the sidewall spacer on the given gate structure;
etching the exposed portion of the set of semiconductor fins to remove the altered region, subsequent to the forming the sidewall spacer; and
performing an epitaxial growth process on the set of semiconductor fins.

13. The method of claim 12, wherein, during the implanting, the gate structure comprises a gate conductor, a gate mask, and a sidewall spacer.

14. The method of claim 12, wherein the ions comprise an inert gas species or a silicon-containing species.

15. The method of claim 14, wherein the implanting the ions comprises implanting an ion dose of 5E17 to 7E19/cm$^2$.

16. The method of claim 14, wherein the ions comprise an ion energy of 5 keV to 15 keV.

17. The method of claim 12, wherein the altered portion comprises a first density, and wherein the unaltered portion comprises a second density, less than the first density.

* * * * *